US011984499B2

(12) United States Patent
Hung et al.

(10) Patent No.: US 11,984,499 B2
(45) Date of Patent: May 14, 2024

(54) SILICON CARBIDE SEMICONDUCTOR DEVICE

(71) Applicant: Shanghai Hestia Power Inc., Shanghai (CN)

(72) Inventors: Chien-Chung Hung, Hsinchu (TW); Kuo-Ting Chu, Hsinchu (TW); Lurng-Shehng Lee, Hsinchu (TW); Chwan-Yin Li, Hsinchu (TW)

(73) Assignee: SHANGHAI HESTIA POWER INC., Shanghai (CN)

( * ) Notice: Subject to any disclaimer, the term of this patent is extended or adjusted under 35 U.S.C. 154(b) by 336 days.

(21) Appl. No.: 17/145,969

(22) Filed: Jan. 11, 2021

(65) Prior Publication Data

US 2022/0223730 A1 Jul. 14, 2022

(51) Int. Cl.

| | |
|---|---|
| ***H01L 29/78*** | (2006.01) |
| ***H01L 21/04*** | (2006.01) |
| ***H01L 21/765*** | (2006.01) |
| ***H01L 29/06*** | (2006.01) |
| ***H01L 29/10*** | (2006.01) |
| ***H01L 29/16*** | (2006.01) |
| ***H01L 29/40*** | (2006.01) |
| ***H01L 29/66*** | (2006.01) |

(52) U.S. Cl.

CPC ........ *H01L 29/7813* (2013.01); *H01L 21/046* (2013.01); *H01L 21/765* (2013.01); *H01L 29/063* (2013.01); *H01L 29/1095* (2013.01); *H01L 29/1608* (2013.01); *H01L 29/407* (2013.01); *H01L 29/66068* (2013.01)

(58) Field of Classification Search

CPC ............. H01L 21/0475; H01L 29/0619; H01L 29/0623; H01L 29/0696; H01L 29/063; H01L 29/0878; H01L 29/1095; H01L 29/1608; H01L 29/407; H01L 29/7813

USPC ........................................................... 257/77

See application file for complete search history.

(56) References Cited

U.S. PATENT DOCUMENTS

| | | | |
|---|---|---|---|
| 9,209,293 | B2 | 12/2015 | Hung et al. |
| 9,246,016 | B1 | 1/2016 | Yen et al. |
| 9,997,599 | B2 | 6/2018 | Cooper |
| 10,403,720 | B2 | 9/2019 | Cooper |
| 10,418,476 | B2 | 9/2019 | Yen et al. |

(Continued)

OTHER PUBLICATIONS

Jheng-Yi Jiang et al., "Numerical Study of 4H—SiC UMOSFETs with Split-Gate and P+ Shielding," *Energies* 2020; 13(5):1122, Mar. 2, 2020, (10 pages).

*Primary Examiner* — Fazli Erdem

(74) *Attorney, Agent, or Firm* — Muncy, Geissler, Olds & Lowe, P.C.

(57) ABSTRACT

A trench silicon carbide metal-oxide semiconductor field effect transistor includes a silicon carbide semiconductor substrate and a trench metal-oxide semiconductor field effect transistor, the field effect transistor includes a trench vertically arranged and penetrating along a first horizontal direction, a gate insulating layer formed on an inner wall of the trench, a first poly gate formed on the gate insulating layer, a shield region formed outsides and below the trench, and a field plate arranged between a bottom wall of the trench and the shield region, and the field plate has semiconductor doping and is laterally in contact to a current spreading layer to deplete electrons of the current spreading layer when a reverse bias voltage is applied.

11 Claims, 10 Drawing Sheets

(56) References Cited

U.S. PATENT DOCUMENTS

| | | | | |
|---|---|---|---|---|
| 2011/0254010 | A1* | 10/2011 | Zhang | H01L 29/7813 438/137 |
| 2017/0069727 | A1* | 3/2017 | Blanchard | H01L 29/42368 |
| 2018/0277637 | A1* | 9/2018 | Meiser | H01L 29/7804 |
| 2018/0308975 | A1* | 10/2018 | Ohse | H01L 29/1608 |
| 2018/0358463 | A1* | 12/2018 | Kobayashi | H01L 29/41766 |
| 2020/0111874 | A1* | 4/2020 | Meiser | H01L 21/046 |
| 2020/0381253 | A1* | 12/2020 | Schulze | H01L 29/0634 |
| 2021/0013310 | A1* | 1/2021 | Leendertz | H01L 29/0615 |

* cited by examiner

SILICON CARBIDE SEMICONDUCTOR DEVICE

FIELD OF THE INVENTION

The present invention relates to a semiconductor device, in particular to a silicon carbide semiconductor device.

BACKGROUND OF THE INVENTION

A semiconductor power device generally requires for high breakdown voltage and has on-state resistance as small as possible, low reverse leakage current and relatively high switching speed to reduce conduction loss and switching loss during operation. As silicon carbide (SiC) is characterized in wide bandgap (Eg=3.26 eV), high critical breakdown field strength (2.2MV/cm), high thermal conductivity coefficient (4.9 W/cm-K) and the like, silicon carbide is considered to be an excellent material for a power switching device. Under the condition with a same breakdown voltage, a thickness of a voltage-sustaining layer (drift layer with low doping concentration) of the power device made with the silicon carbide as a base material is only one tenth of a thickness of that of silicon (Si) power device, and a theoretic on-state resistance may reach a few percent of that of silicon. Therefore, the silicon carbide plays a very important role in some applications, but also needs improvements according to different application demands.

SUMMARY OF THE INVENTION

The present invention relates to a semiconductor device, in particular to a silicon carbide semiconductor device.

The present invention provides a silicon carbide semiconductor device comprising a first silicon carbide semiconductor layer, a second silicon carbide semiconductor layer, a third silicon carbide semiconductor layer, a first semiconductor region, a trench, a second semiconductor region, a gate region, a third semiconductor region, a shield region, and a metal electrode. The first silicon carbide semiconductor layer has a first conductive type. The second silicon carbide semiconductor layer has the first conductive type, and the second silicon carbide semiconductor layer comprises a drift layer arranged on the first silicon carbide semiconductor layer and a current spreading layer arranged on the drift layer. The third silicon carbide semiconductor layer has a second conductive type and arranged on an upper surface of the second silicon carbide semiconductor layer. The first semiconductor region has the first conductive type and arranged in the third silicon carbide semiconductor layer. The trench vertically penetrates through the first semiconductor region and the third silicon carbide semiconductor layer to the second silicon carbide semiconductor layer and extends along a first horizontal direction. The second semiconductor region has the second conductive type, the second semiconductor region comprises a plurality of first portions which extend along a second horizontal direction and formed at the third silicon carbide semiconductor layer and at least one second portion arranged in the second silicon carbide semiconductor layer below the trench, the first portions and the second portion adjoin each other. The gate region is buried into the trench and comprises a gate insulating layer formed on a wall face of the trench and a poly gate formed on the gate insulating layer. The third semiconductor region is arranged outsides the trench, has the second conductive type and comprises a field plate which is at least partially formed in the second silicon carbide semiconductor layer and between the trench and the second portion of the second silicon carbide semiconductor layer, the field plate is laterally in contact to the current spreading layer. The shield region has the second conductive type, the shield region is in the second silicon carbide semiconductor layer below the trench and is below the field plate. The metal electrode is in contact to the first semiconductor region and the gate region.

The present invention further provides a trench silicon carbide metal-oxide semiconductor field effect transistor comprising a silicon carbide semiconductor substrate and a trench metal-oxide semiconductor field effect transistor. The trench metal-oxide semiconductor field effect transistor is formed on the silicon carbide semiconductor substrate, and the trench metal-oxide semiconductor field effect transistor comprises a trench vertically arranged and penetrating along a first horizontal direction. A gate insulating layer is formed on an inner wall face of the trench, a first poly gate is formed on the gate insulating layer, a shield region is formed outsides and below the trench and a field plate is arranged between a bottom wall of the trench and the shield region. The field plate has semiconductor doping and is laterally in contact to a current spreading layer to deplete electrons of the current spreading layer when a reverse bias voltage is applied.

DETAILED DESCRIPTION OF THE PREFERRED EMBODIMENTS

Terms used in descriptions of various embodiments are for the purpose of describing particular embodiments only and are not intended to be limiting.

Unless otherwise clearly stated by context or intentionally limiting the number of devices, the singular forms “a”, “an” and “the” include the plural forms as well. In another aspect, terms “comprising” and “including” are intended to be comprised insides, that is, additional devices may be present in addition to the listed devices. When an device is referred to as being “connected” or “coupled” to another device, it can be directly connected or coupled to the other device or intervening devices may be present. When an device for describing a layer, a region or a substrate is referred to as being “on” another device, it can be directly on the other device or an intervening device may also be present therebetween, and relatively, when the device is referred to as being “directly on” another device, there are no intervening device therebetween. Furthermore, the order of descriptions of various embodiments should not be construed to imply that operations or steps are literally order dependent.

Herein, each layer and/or region is characterized as having a conductive type, such as n-type or p-type, which refers to majority carrier species in the layer and/or region. An n-type material includes an equilibrium excess electron, and a p-type material includes an equilibrium excess hole. Some materials may use "+" or "−" (e.g., $n^+$、$n^-$、$p^+$、$p^-$) for labeling to indicate to have relatively large ($^+$) or small ($^-$) majority carrier concentration compared with another layer or region, and the mark does not represent a concrete concentration of a carrier. In drawings, a thickness of each layer and/or region is enlarged for more clarity of illustrations.

The present invention provides a silicon carbide semiconductor device and particularly provides a trench silicon carbide metal-oxide semiconductor field effect transistor, while in some embodiments, the silicon carbide semiconductor device may also the trench metal-oxide semiconductor field effect transistor with integrating other devices, for example, a trench metal-oxide semiconductor field effect transistor with integrating a Schottdy diode.

Figure 1:
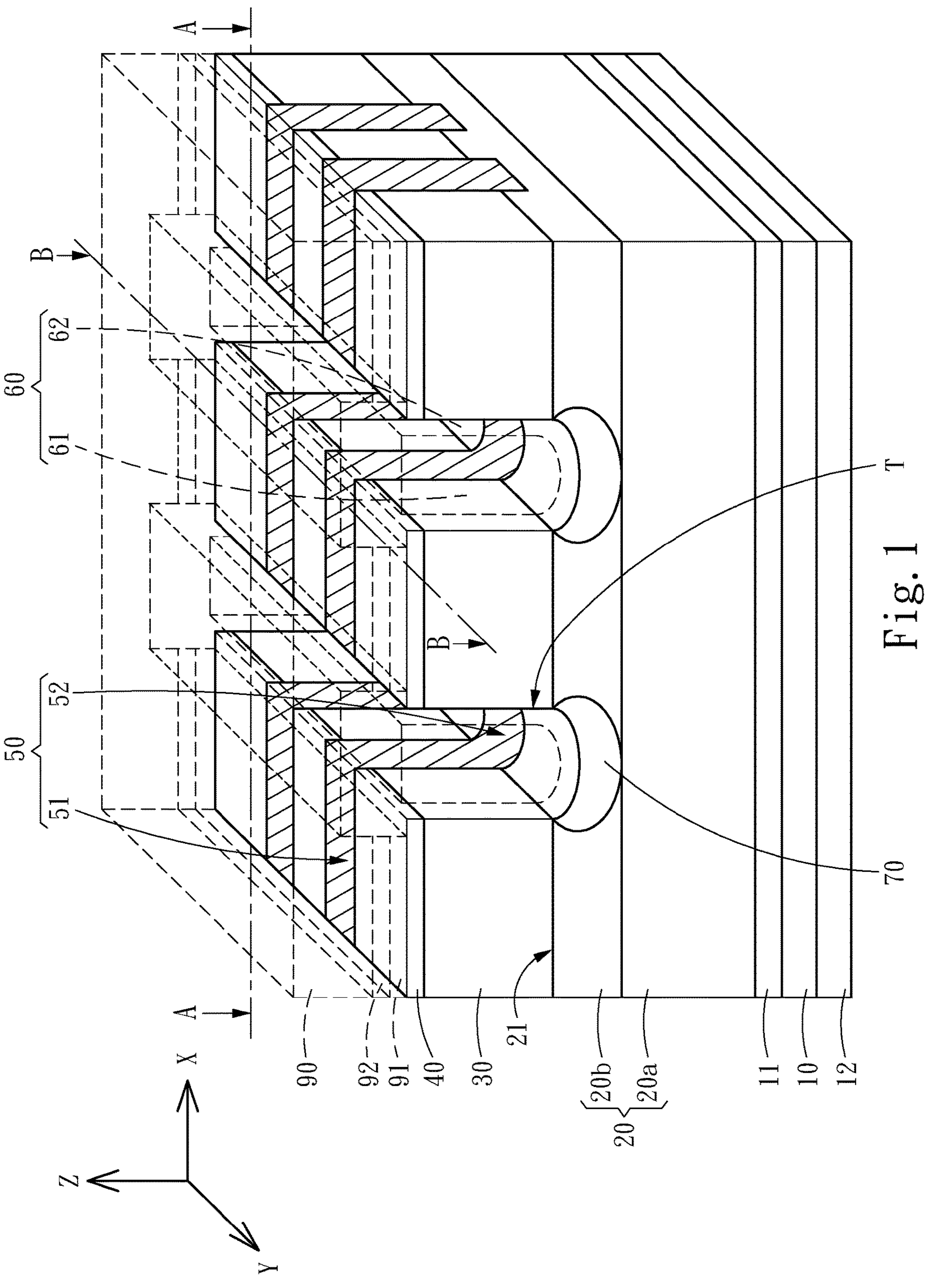
FIG. 1 is a perspective schematic diagram according to an embodiment of the present invention.
Figure 2:
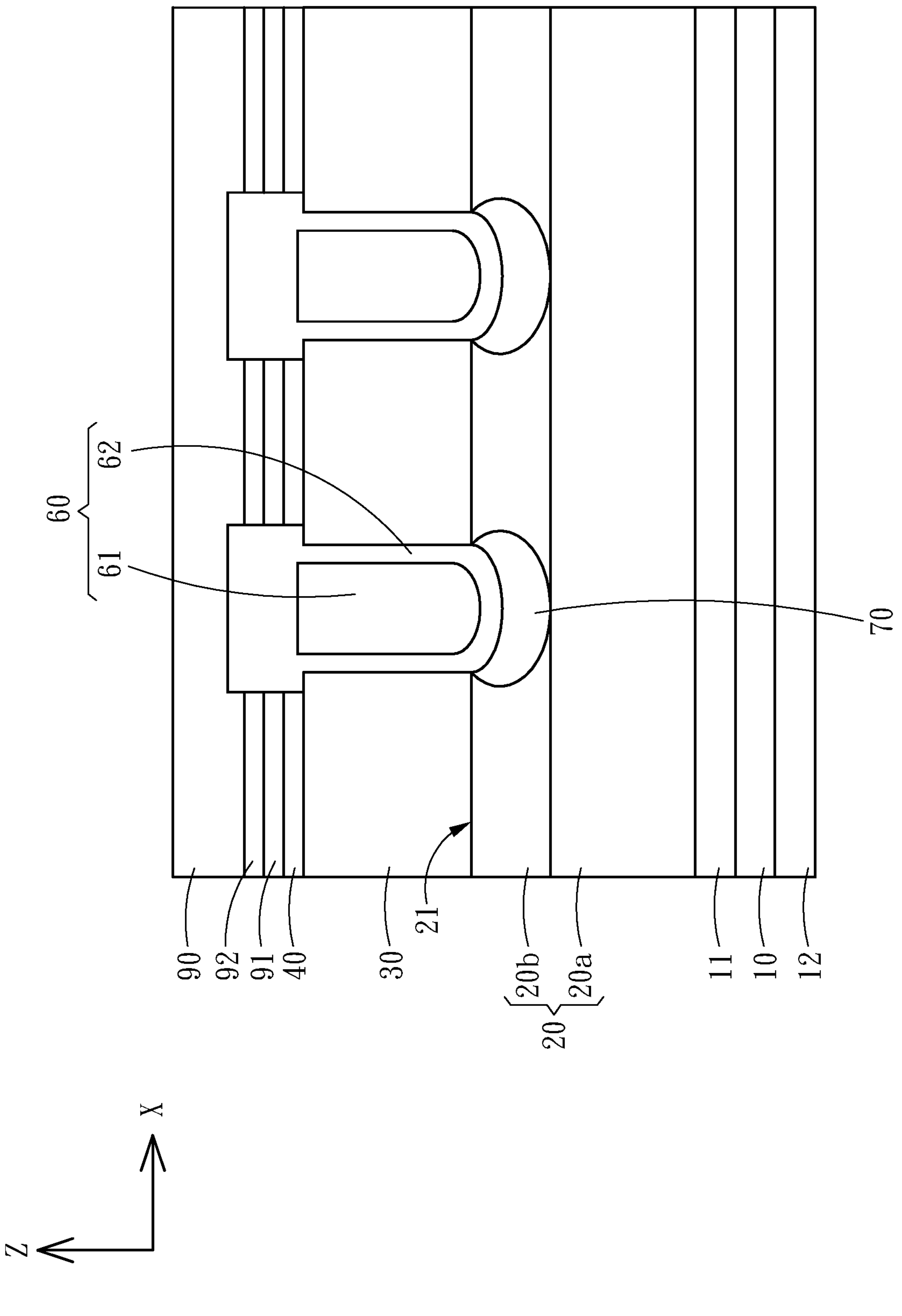
FIG. 2 is a front schematic view of FIG. 1.

Referring to FIG. 1 and FIG. 2 which are a perspective schematic diagram according to an embodiment of the present invention and a front schematic view of FIG. 1 respectively, a part of devices are presented by dashed lines based on convenience of statements. The silicon carbide semiconductor device includes a first silicon carbide semiconductor layer 10, a second silicon carbide semiconductor layer 20, a third silicon carbide semiconductor layer 30, a first semiconductor region 40, a second semiconductor region 50, a gate region 60, a third semiconductor region, a shield region 80 (shown in FIG. 3) and a metal electrode 90.

The first silicon carbide semiconductor layer 10 has a first conductive type; and in the present embodiment, the first conductive type is n-type. The first silicon carbide semiconductor layer 10 is an $n^+$ silicon carbide substrate. A buffer layer 11 is provided on the first silicon carbide semiconductor layer 10. A metal drain layer 12 is provided below the first silicon carbide semiconductor layer 10. The second silicon carbide semiconductor layer 20 is provided on the buffer layer 11 and includes an $n^-$-type drift layer 20*a* and an n-type current spreading layer 20*b*. The third silicon carbide semiconductor layer 30 is provided on the n-type current spreading layer 20*b*, and the third silicon carbide semiconductor layer 30 is a p-type base region and is arranged on an upper surface 21 of the second silicon carbide semiconductor layer 20. The first semiconductor region 40 is formed in an upper surface of the third silicon carbide semiconductor layer 30 by ion implantation and the first semiconductor region 40 is an $n^+$ source region.

In the present embodiment, a thickness of the n-type current spreading layer 20*b* is in a range between 0.5 μm and 1.5 μm, a thickness of the third silicon carbide semiconductor layer 30 is in a range between 1.0 μm and 2.0 μm, and a thickness of the first semiconductor region 40 is about 0.5 μm. The $n^-$-type drift layer 20*a* has a doping concentration in a range between 5E14 and 5E16; the n-type current spreading layer 20*b* has a doping concentration in a range between 1E16 and 5E18, for example, 5E17; the p-type base electrode region has a doping concentration in a range between 1E17 and 5E19, for example, 1E18; and the $n^+$ source region has a doping concentration in a range between 1E18 and 5E20, for example, 1E20. In one embodiment, the buffer layer 11, the second silicon carbide semiconductor layer 20 and the third silicon carbide semiconductor layer 30 are epitaxial layers formed by epitaxial growth.

The silicon carbide semiconductor device includes a plurality of trenches T, and the plurality of trenches T are formed by etching process. The plurality of trenches T are arranged at intervals and extend along a first horizontal direction; and in the present embodiment, the first horizontal direction is an Y axis in the figure. In the present embodiment, the plurality of trenches T vertically penetrate through the first semiconductor region 40 and the third silicon carbide semiconductor layer 30 to be close to a junction between the n-type current spreading layer 20*b* and the third silicon carbide semiconductor layer 30 (i.e. the upper surface 21 of the second silicon carbide semiconductor layer 20). Each of the plurality of trench T has a depth in a range between 1.0 μm and 2.0 μm and a width in a range between 0.5 μm and 2.0 μm.

Figure 3:
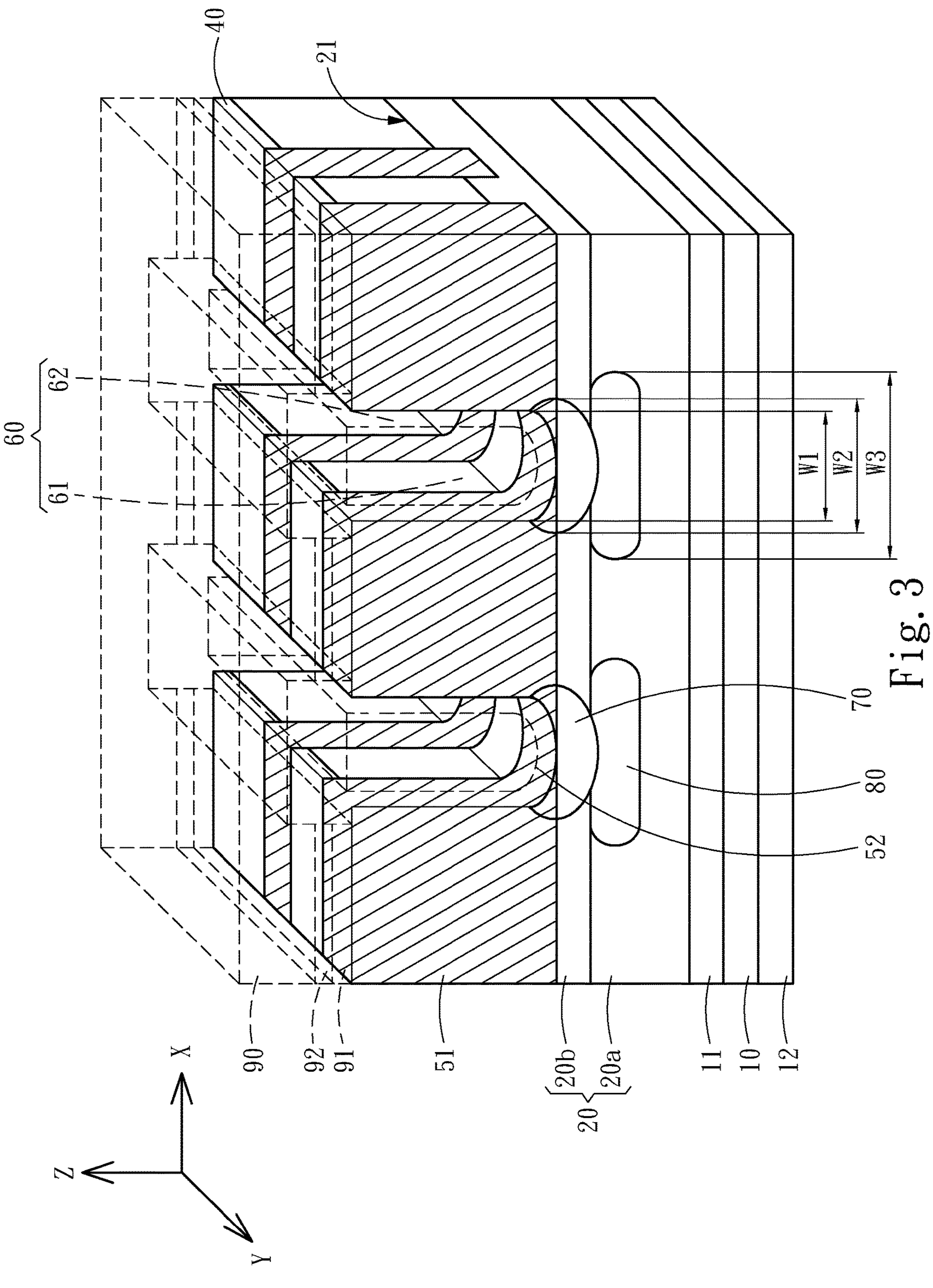
FIG. 3 is a perspective cross-sectional view of FIG. 1 along A-A.

Referring to FIG. 3 which is a perspective cross-sectional view of FIG. 1 along A-A, the second semiconductor region 50 has a second conductive type, and includes a plurality of first portions 51 and a plurality of second portions 52. The second semiconductor region 50 comprises segmental implant regions arranged at intervals and extending along a second horizontal direction, wherein the segmental implant regions are segmentally implanted to be formed in the third silicon carbide semiconductor layer 30 and the second silicon carbide semiconductor layer 20, thereby the second semiconductor region 50 surrounds the plurality of trenches T. In the present embodiment, the second horizontal direction is an X axis in the figure. Refer to FIG. 3, the plurality of first portions 51 is formed vertically from a region adjacent to the upper surface of the first semiconductor region 40 to a region adjacent to the n-type current spreading layer 20*b*, and the plurality of second portions 52 is formed in the second silicon carbide semiconductor layer 20 below the plurality of trenches T. In one embodiment, an implant depth of the second semiconductor region 50 is in a range between 1.0 μm and 2.5 μm, which is enough to enable the second semiconductor region 50 to be deeper than the plurality of trenches T. In one embodiment, the second semiconductor region 50 (i.e. the first portions 51 and the second portions 52) is a pickup portion ($p^+$ pickup).

The gate region 60 includes a gate insulating layer 62 and a poly gate 61. The gate insulating layer 62 is formed on a part of the surface of the first semiconductor region 40 and a part of the surfaces of the plurality of first portions 51, and the gate insulating layer 62 extends lengthwise along sidewalls of the plurality of trenches T to cover a part of the surface of the third silicon carbide semiconductor layer 30 and a part of the surface of the second silicon carbide semiconductor layer 20. The poly gate 61 is formed on the gate insulating layer 62.

Figure 4:
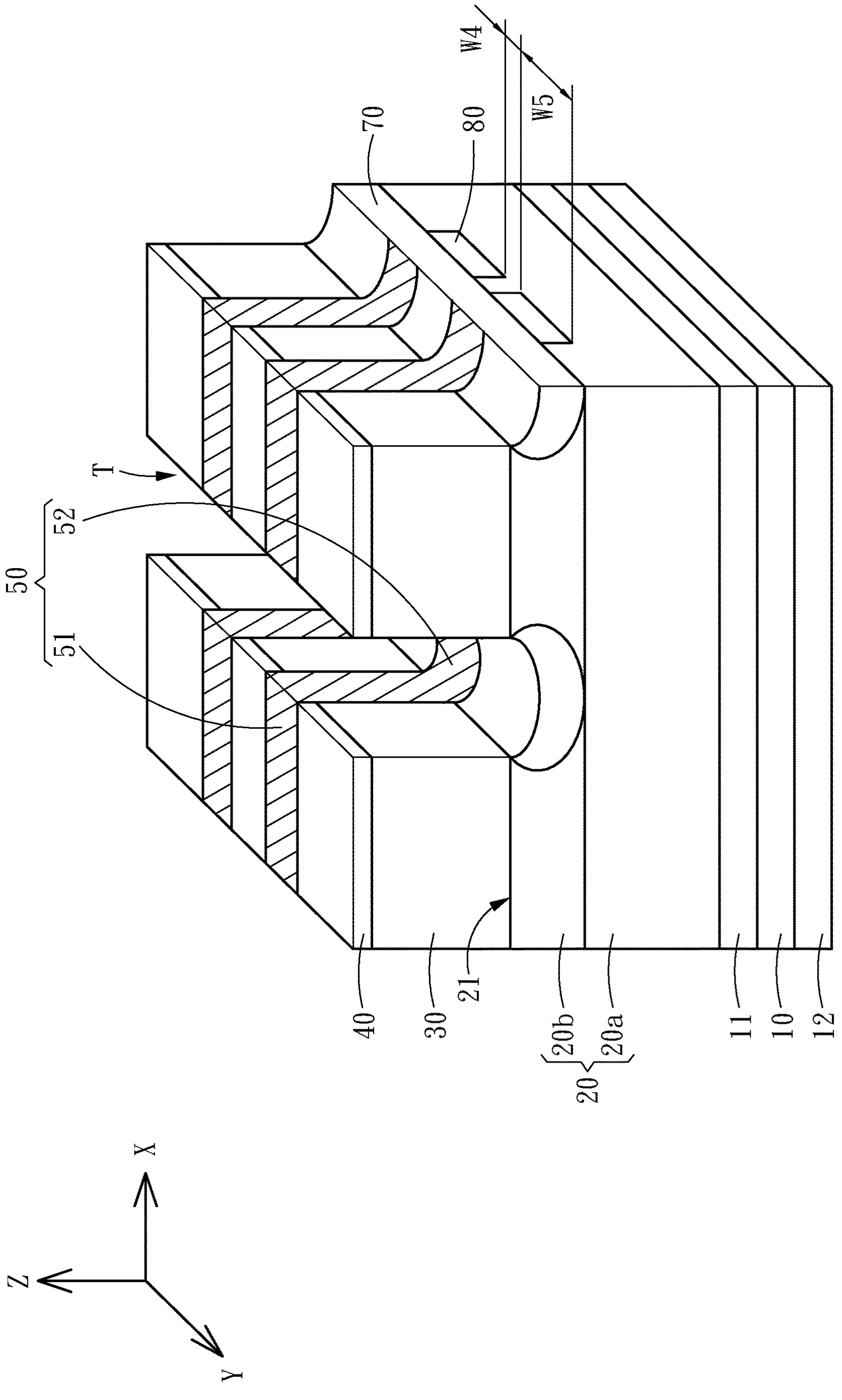
FIG. 4 is a perspective cross-sectional view of FIG. 1 along B-B.
Figure 5:
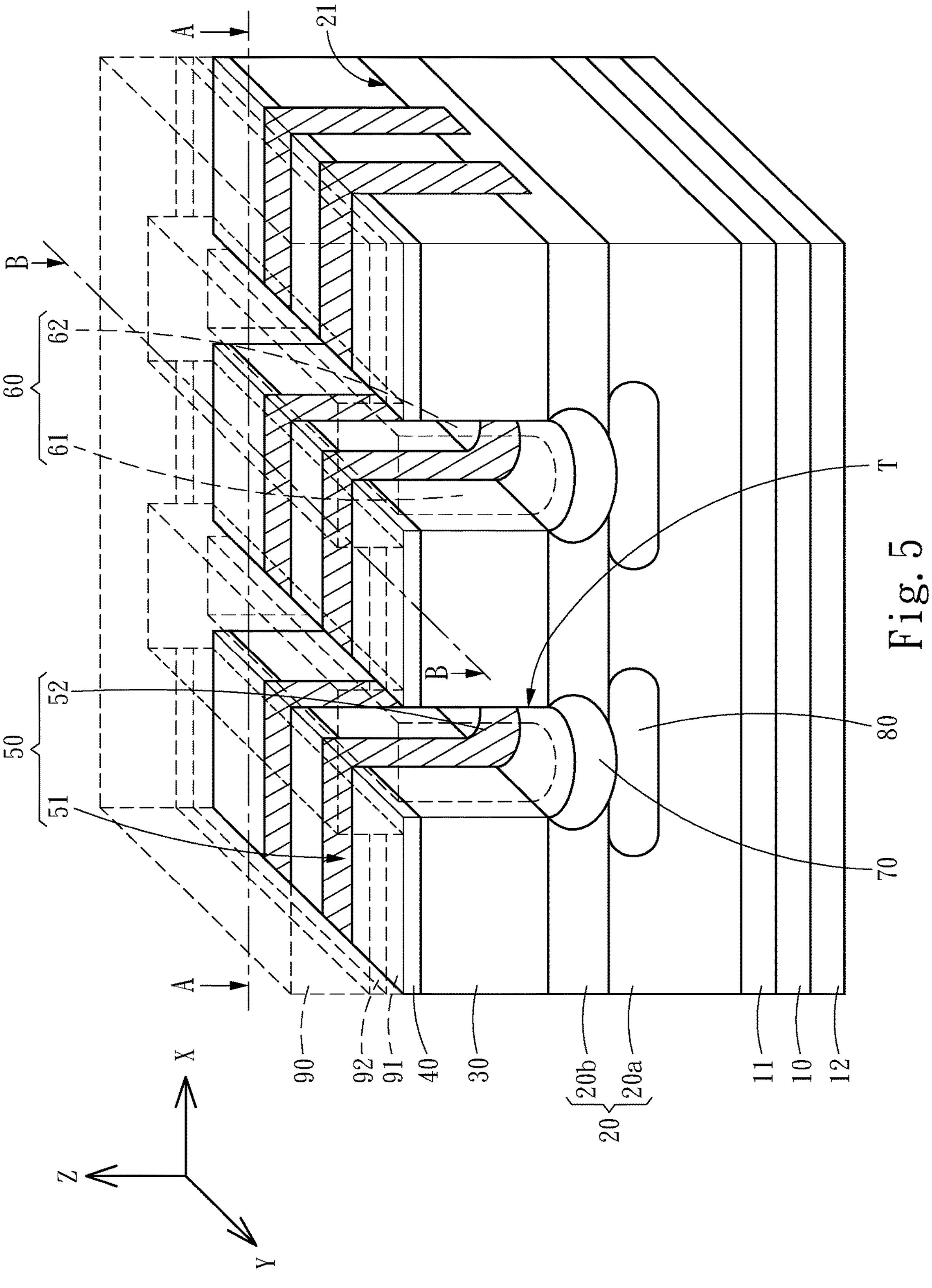
FIG. 5 is a perspective schematic diagram according to another embodiment of the present invention.
Figure 6:
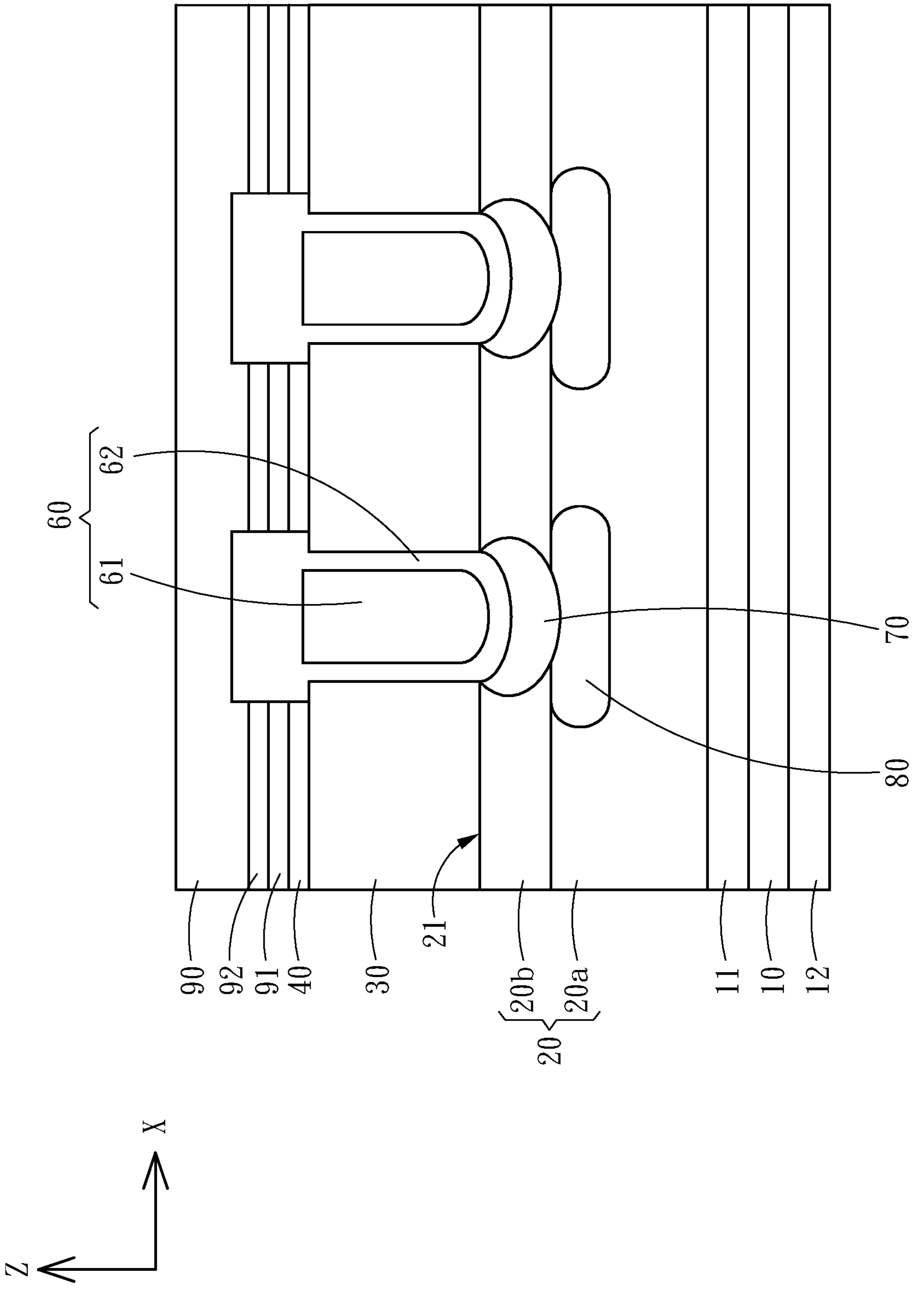
FIG. 6 is a front schematic view of FIG. 5.
Figure 7:
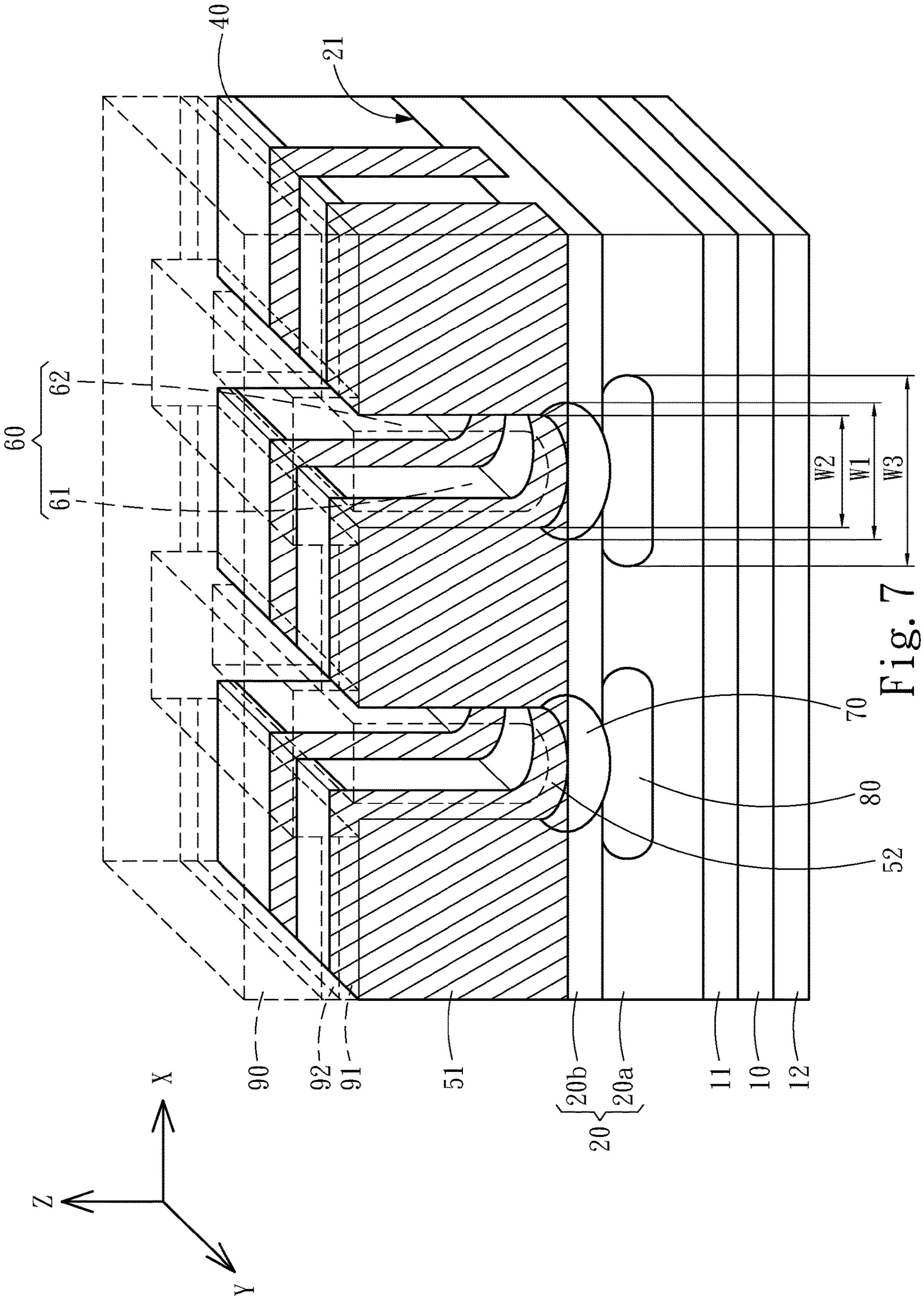
FIG. 7 is a perspective cross-sectional view of FIG. 5 along A-A.
Figure 8:
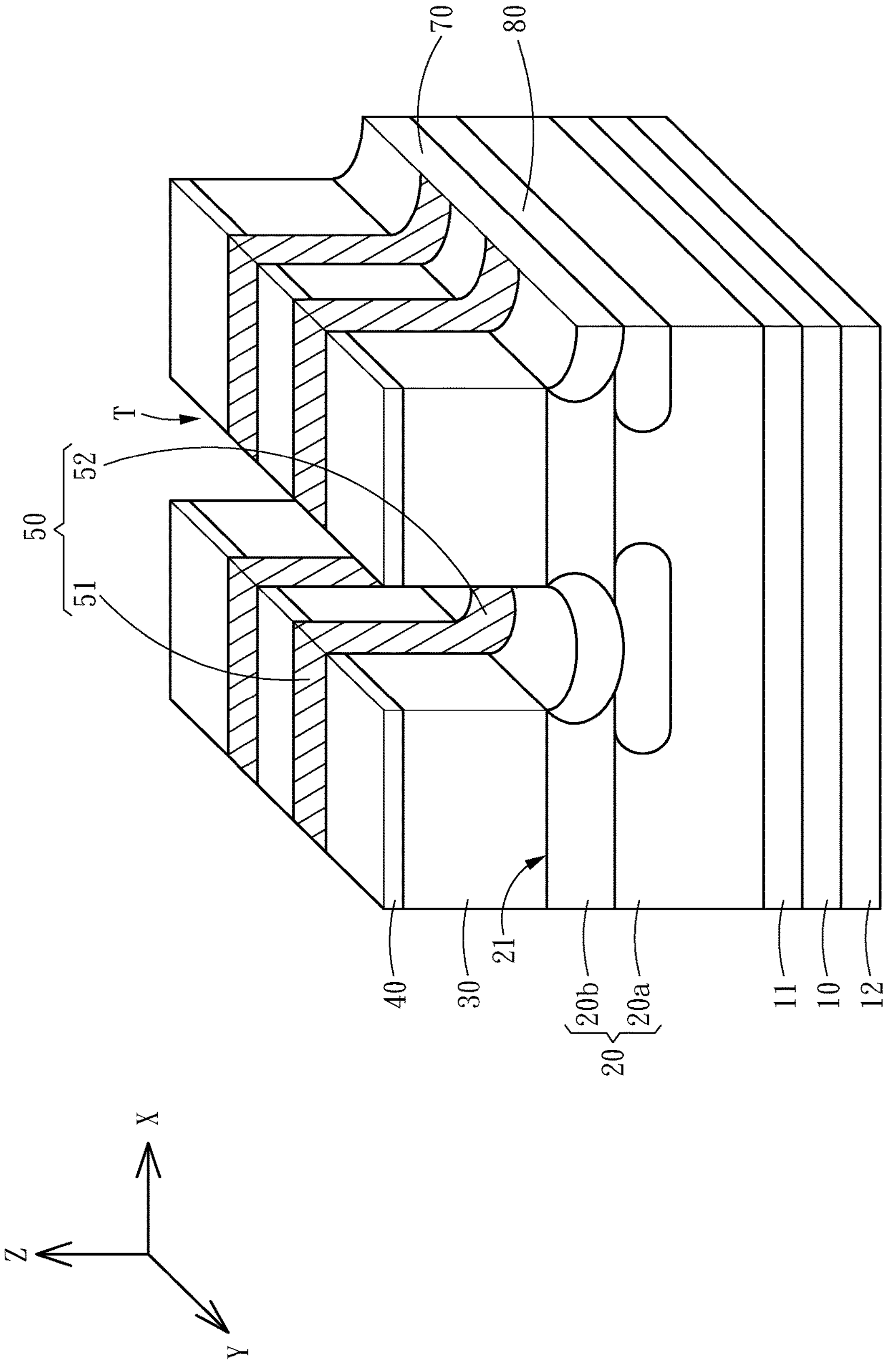
FIG. 8 is a perspective cross-sectional view of FIG. 5 along B-B.

The third semiconductor region is arranged outsides the plurality of trenches T. The third semiconductor region has a second conductive type and includes a field plate 70. The field plate 70 is arranged below the plurality of trenches T, and side walls of the field plate 70 are in contact to the n-type current spreading layer 20*b* to form a lateral junction. In the present embodiment, a thickness of the field plate 70 approximately corresponds to that of the n-type current spreading layer 20*b*, in other words, a height of the lateral junction is in a range between 0.5 μm and 1.5 μm. The shield region 80 is formed in the $n^-$-type drift layer 20*a*. The plurality of second portions 52 of the second semiconductor region 50 is electrically connected to the field plate 70, as shown in FIG. 3. Referring to FIG. 4 which is a perspective cross-sectional view of FIG. 1 along B-B, the shield region 80 has the second conductive type and is in the second silicon carbide semiconductor layer 20 below the plurality of trenches T and below the field plate 70. In the present embodiment, the shield region 80 includes a plurality of shield blocks, and the plurality of shield blocks are segmentally arranged below the plurality of trenches T along the Y axis. In the present embodiment, both of the field plate 70 and the shield region 80 are P-type doping, wherein the doping concentration of the field plate 70 is in a range between 1E18 and 1E20, and the doping concentration of the shield region 80 is in a range between 1E18 and 1E20.

A metal silicide layer 91 is formed on the surfaces of the third silicon carbide semiconductor layer 30 and the plurality of first portions 51 of the second semiconductor region 50, and a metal layer 92 is formed on the metal silicide layer 91. In the present embodiment, the metal silicide layer 91 is nickel silicide (NiSi), and the metal layer 92 is alloy, for example, Ti/TiN. The metal electrode 90 covers upper surfaces of the metal layer 92 and the gate region 60. In the present embodiment, the metal electrode 90 is AlCu.

Dimension relationships between a part of the devices/regions of the silicon carbide semiconductor device will be stated below. Dimensions of these devices/regions are not fixed values due to fabrication methods, for example, when forming the field plate 70, a dopant profile of the field plate 70 may be uneven due to the ion implantation process. Therefore, the dimension of these devices/regions are defined by a maximum width herein. Referring to FIG. 3, the gate region 60 has a first maximum width W1, the field plate 70 has a second maximum width W2, and the shield region 80 has a third maximum width W3. In one embodiment, the second maximum width W2 is smaller than the first maximum width W1 and the third maximum width W3, while the third maximum width W3 is larger than the first maximum width W1. In another aspect, referring to FIG. 4, the plurality of shield blocks of the shield region 80 is segmentally arranged below the plurality of trenches T along the Y axis respectively. A pitch W4 is provided between the plurality of shield blocks and is in a range between 0.5 μm and 2.0 μm. Each shield block has a length W5 in the Y axis, and the length W5 is in a range between 0.5 μm and 3.0 μm. By segmentally arranging the plurality of shield blocks, corners of the plurality of trenches can be properly protected, more regions (i.e. the $n^{-}$-type drift layer 20*a* without the shield region 80 formed) can also be kept for electrons and/or a current to pass through, and thus low on-state resistance ($R_{ON,\ SP}$) is ensured.

Figure 9:
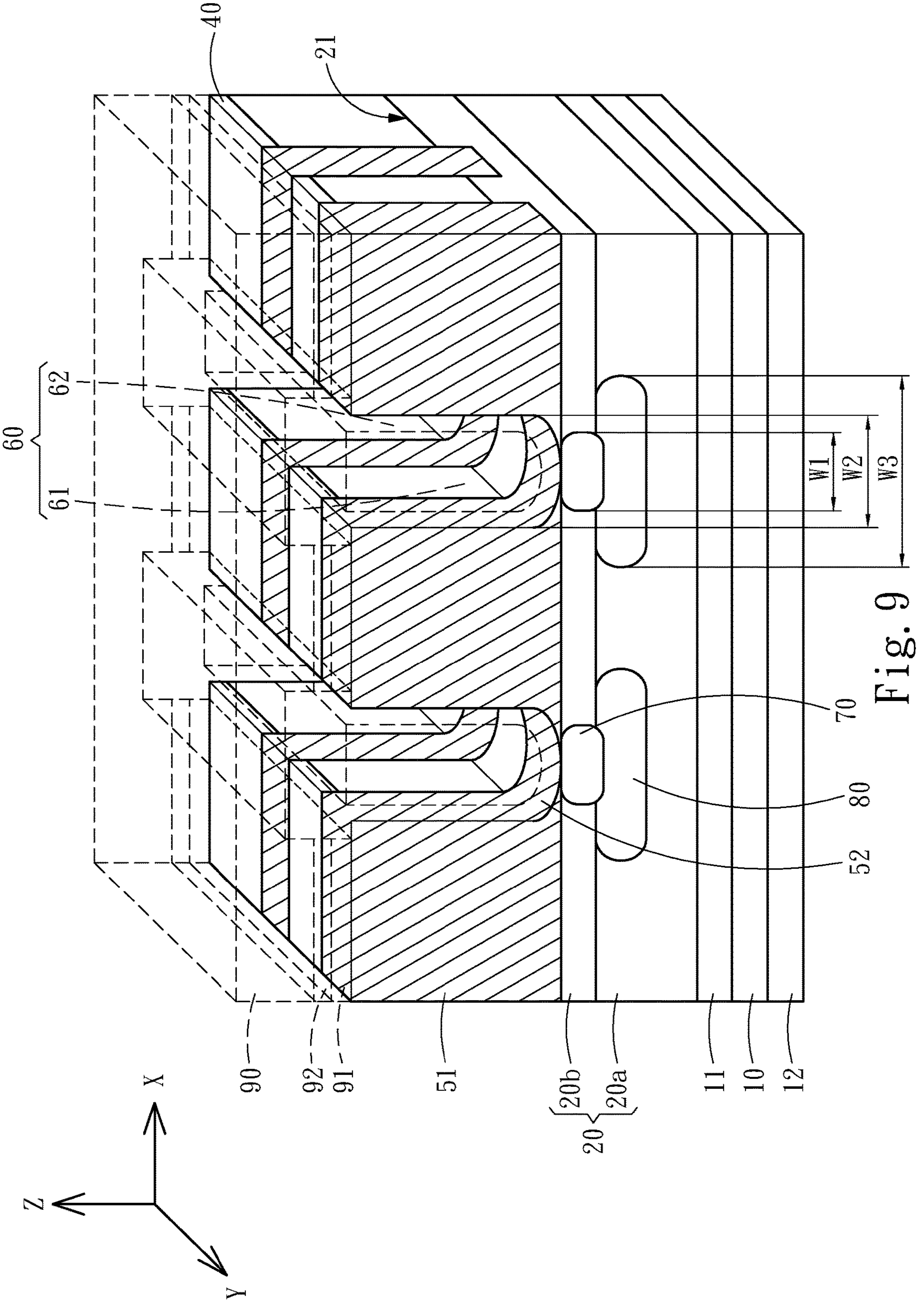
FIG. 9 is a perspective sectional view according to another embodiment of the present invention.

However, a structure of the shield region 80 may be adjusted according to different applications or configurations, and so are dimension relationships between the gate region 60, the field plate 70 and the shield region 80. For example, referring to FIG. 5, FIG. 6, FIG. 7 and FIG. 8 which are schematic diagrams of another embodiment of the present invention, the shield region 80 extends below the plurality of trenches T along the Y axis to form a shield section of a continuous structure. Alternatively, referring to FIG. 9, in another embodiment, the first maximum width W1 is smaller than the second maximum width W2 and the third maximum width W3, while the third maximum width W3 is larger than the second maximum width W2.

Figure 10:
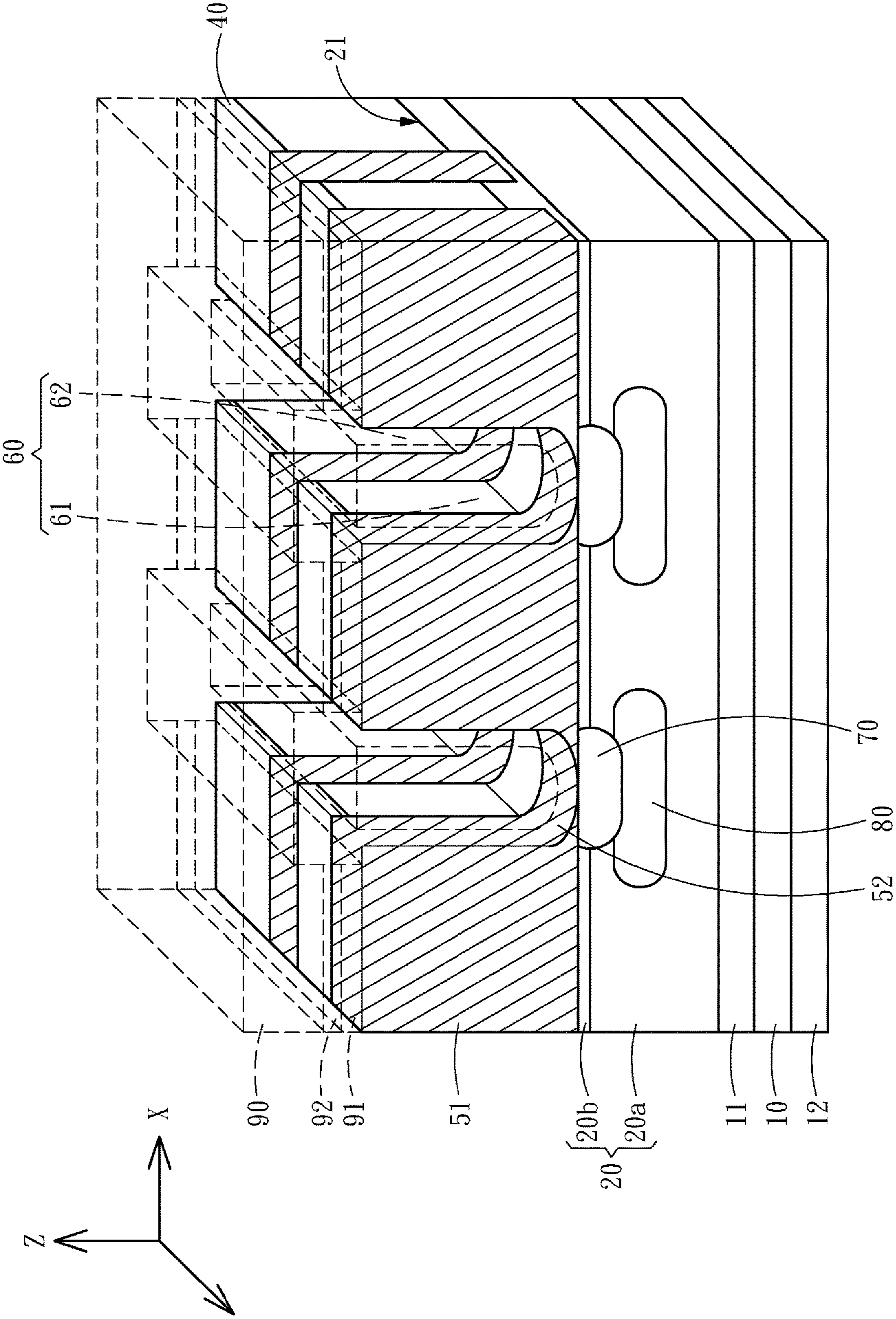
FIG. 10 is a perspective sectional view according to another embodiment of the present invention.

Referring to FIG. 10, in other embodiments, the field plate 70 is adjusted according to a depth of a trench T relative to the second silicon carbide semiconductor layer 20. In the embodiment of FIG. 10, a bottom wall of the trench T is closer to the $n^{-}$-type drift layer 20*a*, and the field plate 70 is formed in the $n^{-}$-type drift layer 20*a* and the n-type current spreading layer 20*b* below the trench T, wherein sidewalls of the field plate 70 are still in contact to the n-type current spreading layer 20*b* to form the lateral junction.

In the present invention, by arranging the field plate 70 outsides the trench T, the sidewalls of the field plate 70 are in contact to the n-type current spreading layer 20*b* to form the lateral junction, thereby when a reverse bias voltage is applied to the silicon carbide semiconductor device, the electrons of the n-type current spreading layer 20*b* are rapidly depleted by the field plate 70, such that the on-state resistance ($R_{ON,\ SP}$) and a gate-drain reverse capacitance ($C_{rss}$) are improved (lowered), and the device can be operated at a higher speed.

According to one embodiment of the present invention, a fabrication method of the silicon carbide semiconductor device includes the following steps:

Step A1: providing a silicon carbide semiconductor substrate, forming the $n^{-}$-type drift layer 20*a* at the silicon carbide semiconductor substrate by an epitaxial process to form.

Step A2: forming the shield region 80 by ion implantation after the $n^{-}$-type drift layer 20*a* is finished for the embodiments of FIG. 1, FIG. 2, FIG. 3, FIG. 4, FIG. 5, FIG. 6, FIG. 7 and FIG. 8.

Step A3: forming the n-type current spreading layer 20*b* and the third silicon carbide semiconductor layer 30, wherein the n-type current spreading layer 20*b* is formed by the epitaxial process, the third silicon carbide semiconductor layer 30 is formed by the epitaxial process or ion implantation, a thickness of the n-type current spreading layer 20*b* is in a range between 0.5 μm and 1.5 μm, and a thickness of the third silicon carbide semiconductor layer 30 is in a range between 1.0 μm and 2.0 μm.

Step A4: forming the second semiconductor region 50 by ion implantation, wherein a thickness of the second semiconductor region 50 is in a range between 1.0 μm and 2.5 μm.

Step A5: forming the first semiconductor region 40 on the third silicon carbide semiconductor layer 30 between the second semiconductor region 50 by ion implantation, wherein a thickness of the first semiconductor region 40 is about 0.5 μm.

Step A6: forming the trench T by etching, a depth of the trench T is in a range between 1.0 μm and 2.0 μm. In the present embodiment, a bottom wall of the trench T is close to a bottom of the third silicon carbide semiconductor layer 30, i.e. the upper surface 21 of the n-type current spreading layer 20*b*.

Step A7: forming the field plate 70 below the trench T by ion implantation, wherein the thickness of the field plate 70 approximately corresponds to that of the n-type current spreading layer 20*b*.

Step A8: forming the gate region 60 in the trench T, and then forming elements such as the metal silicide layer 91, the metal layer 92 and the metal electrode 90.

According to another embodiment of the present invention, a fabrication method of the silicon carbide semiconductor device includes the following steps:

Step B1: providing a silicon carbide semiconductor substrate, forming the $n^{-}$-type drift layer 20*a* and the n-type current spreading layer 20*b* at the silicon carbide semiconductor substrate by the epitaxial process, wherein the thickness of the n-type current spreading layer 20*b* is in a range between 0.5 μm and 1.5 μm.

Step B2: forming the third silicon carbide semiconductor layer 30 by the epitaxial process or ion implantation, wherein the thickness of the third silicon carbide semiconductor layer 30 is in a range between 1.0 μm and 2.0 μm.

Step B3: forming the second semiconductor region 50 by ion implantation, the thickness of the second semiconductor region 50 is in a range between 1.0 μm and 2.5 μm.

Step B4: forming the first semiconductor region 40 on the third silicon carbide semiconductor layer 30 in the second semiconductor region 50 by ion implantation, the thickness of the first semiconductor region 40 is about 0.5 μm.

Step B5: forming the trench T by etching, a depth of the trench T is in a range between 1.0 μm and 2.0 μm. In the present embodiment, a bottom wall of the trench T is close to a bottom of the third silicon carbide semiconductor layer 30, i.e. the upper surface 21 of the n-type current spreading layer 20*b*.

Step B6: forming the shield region 80 below the trench T by ion implantation.

Step B7: forming the field plate 70 below the trench T by ion implantation, wherein the thickness of the field plate 70 approximately corresponds to that of the n-type current spreading layer 20*b*. In other embodiments, the field plate 70 is formed before the shield region 80.

Step B8: forming the gate region 60 in the trench T, and then forming elements such as the metal silicide layer 91, the metal layer 92 and the metal electrode 90.

According to the present embodiment, in the steps B6 and B7, an inclination angle of ion implantation may be properly adjusted to change the width of the shield region 80 and/or the field plate 70.

According to a further embodiment of the present invention, a fabrication method of the silicon carbide semiconductor device includes the following steps:

Step C1: providing a silicon carbide semiconductor substrate, forming the $n^-$-type drift layer 20*a* and the n-type current spreading layer 20*b*, wherein the thickness of the n-type current spreading layer 20*b* is in a range between 0.5 μm and 1.5 μm.

Step C2: forming the third silicon carbide semiconductor layer 30 by the epitaxial process or ion implantation, wherein the thickness of the third silicon carbide semiconductor layer 30 is in a range between 1.0 μm and 2.0 μm.

Step C3: forming the second semiconductor region 50 by ion implantation, the thickness of the second semiconductor region 50 is in a range between 1.0 μm and 2.5 μm.

Step C4: forming the first semiconductor region 40 on the third silicon carbide semiconductor layer 30 in the second semiconductor region 50 by ion implantation, a thickness of the first semiconductor region 40 is about 0.5 μm.

Step C5: forming the trench T by etching, a depth of the trench T is in a range between 1.0 μm and 2.0 μm. In the present embodiment, a bottom wall of the trench T is close to a lower surface of the n-type current spreading layer 20*b*.

Step C6: forming the shield region 80 below the trench T by ion implantation.

Step C7: forming the field plate 70 at the bottom wall of the trench T by the epitaxial process, wherein a thickness of the field plate 70 approximately corresponds to that of the n-type current spreading layer 20*b*.

Step C8: forming the gate region 60 in the trench T, and then forming elements such as the metal silicide layer 91, the metal layer 92 and the metal electrode 90.

The above fabrication methods are intended to be illustrative only, but the present invention is not limited to it, and other fabrication methods may also be employed according to different demands.

What is claimed is:

1. A silicon carbide semiconductor device, comprising:

a first silicon carbide semiconductor layer, having a first conductive type;

a second silicon carbide semiconductor layer, having the first conductive type and comprising a drift layer arranged on the first silicon carbide semiconductor layer and a current spreading layer arranged on the drift layer;

a third silicon carbide semiconductor layer, having a second conductive type and arranged on an upper surface of the second silicon carbide semiconductor layer;

a first semiconductor region, having the first conductive type and arranged in the third silicon carbide semiconductor layer;

a trench, vertically penetrating through the first semiconductor region and the third silicon carbide semiconductor layer to the second silicon carbide semiconductor layer and extending along a first horizontal direction;

a second semiconductor region, having the second conductive type, the second semiconductor region comprising a plurality of first portions which extends along a second horizontal direction and being formed in the third silicon carbide semiconductor layer and at least one second portion in the second silicon carbide semiconductor layer below the trench, wherein the first portions and the second portion adjoin each other, and the second semiconductor region surrounds the trench;

a gate region, buried into the trench and comprising a gate insulating layer formed on a wall of the trench and a poly gate formed on the gate insulating layer;

a third semiconductor region, arranged outsides the trench and having the second conductive type, the third semiconductor region comprising a field plate which is at least partially formed in the second silicon carbide semiconductor layer and is between the trench and the second portion of the second semiconductor region, side walls of the field plate are in contact to the current spreading layer;

a shield region, having the second conductive type, the shield region being in the second silicon carbide semiconductor layer below the trench and below the field plate; and a metal electrode, in contact to the first semiconductor region and the gate region.

2. The silicon carbide semiconductor device according to claim 1, wherein the gate region has a first maximum width, the field plate has a second maximum width, the shield region has a third maximum width, and the second maximum width is smaller than the first maximum width and is smaller than the third maximum width.

3. The silicon carbide semiconductor device according to claim 1, wherein the gate region has a first maximum width, the field plate has a second maximum width, the shield region has a third maximum width, and the second maximum width is larger than the first maximum width and is smaller than the third maximum width.

4. The silicon carbide semiconductor device according to claim 1, wherein a thickness of the field plate corresponds to that of the current spreading layer.

5. The silicon carbide semiconductor device according to claim 1, wherein the trench vertically penetrates through the first semiconductor region and the third silicon carbide semiconductor layer to enable a bottom wall of the trench to be close to a bottom of the third silicon carbide semiconductor layer.

6. The silicon carbide semiconductor device according to claim 1, wherein the trench vertically penetrates through the first semiconductor region and the third silicon carbide semiconductor layer to enable a bottom wall of the trench to be close to a bottom of the current spreading layer.

7. The silicon carbide semiconductor device according to claim 1, wherein the shield region extends below the trench along the first horizontal direction to form a shield section of a continuous structure.

8. The silicon carbide semiconductor device according to claim 1, wherein the shield region comprises a plurality of shield blocks which are segmentally arranged below the trench along the first horizontal direction.

9. The silicon carbide semiconductor device according to claim 8, wherein a pitch provided between the shield blocks along the first horizontal direction is in a range between 0.5 μm and 3.0 μm.

10. The silicon carbide semiconductor device according to claim 1, wherein a lateral junction is formed between the field plate and the current spreading layer and has a height between 0.5 μm and 1.5 μm.

11. The silicon carbide semiconductor device according to claim 1, wherein the gate region and the field plate are separated from each other, and the field plate is in contact to the shield region.

* * * * *